United States Patent
Luo et al.

(10) Patent No.: US 6,359,516 B1
(45) Date of Patent: Mar. 19, 2002

(54) HIGH-FREQUENCY AMPLIFIER CIRCUIT WITH INDEPENDENT CONTROL OF QUIESCENT CURRENT AND BIAS IMPEDANCE

(75) Inventors: Sifen Luo, Hartsdale; Tirdad Sowlati, Ossining, both of NY (US)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 09/621,525

(22) Filed: Jul. 21, 2000

(51) Int. Cl.[7] .............................................. H03F 3/04
(52) U.S. Cl. ...................... 330/296; 330/288; 323/314; 323/315; 323/316
(58) Field of Search ................................ 323/314, 315, 323/316; 330/288, 296

(56) References Cited

U.S. PATENT DOCUMENTS

| | | | |
|---|---|---|---|
| 3,906,386 A | * 9/1975 | Hongu et al. | 330/296 |
| 5,548,248 A | 8/1996 | Wang | 330/288 |
| 5,619,152 A | 4/1997 | Holtvoeth et al. | 327/110 |
| 5,670,912 A | 9/1997 | Zocher | 330/296 |
| 5,828,269 A | 10/1998 | Wong et al. | 330/275 |
| 6,194,956 B1 | * 2/2001 | Barnes | 323/315 |

FOREIGN PATENT DOCUMENTS

| | | |
|---|---|---|
| DE | 19821735 A | 6/1999 |
| JP | 9167928 | * 6/1997 |

OTHER PUBLICATIONS

Millman "Microelectronics Digital and Analog Circuits and Systems" McGraw–Hill Inc, 1979 p538.*
"Understanding Linearity in Wireless Communication Amplifiers", by Wayne Struble et al., IEEE Journal of Solid State Circuits, vol. 32, No. 9, Sep. 1997, pp. 1310–1318.

* cited by examiner

*Primary Examiner*—Michael B Shingleton
(74) *Attorney, Agent, or Firm*—Steven R. Biren

(57) ABSTRACT

A high-frequency amplifier circuit includes an amplifying transistor and a bias circuit coupled to the amplifying transistor. The bias circuit includes a first bias subcircuit for controlling a quiescent current in the amplifying transistor and a second bias subcircuit for independently controlling a bias impedance of the amplifying transistor. Using this configuration, it is possible to set the gain and class of operation of the amplifying transistor, while independently controlling the bias impedance of the amplifying transistor to obtain improved linearity and tuning capability as well as increased efficiency.

6 Claims, 1 Drawing Sheet

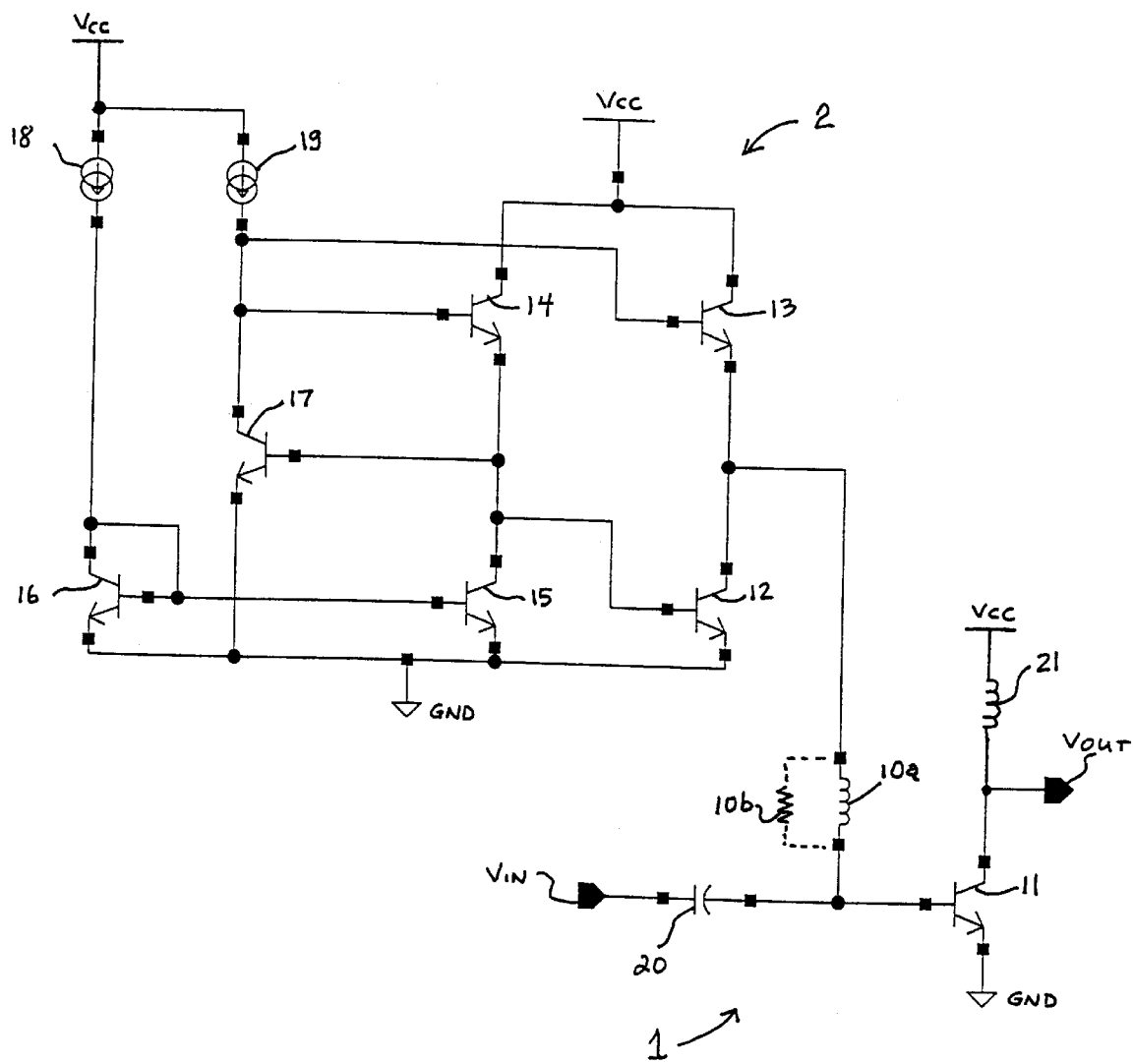

HIGH-FREQUENCY AMPLIFIER CIRCUIT WITH INDEPENDENT CONTROL OF QUIESCENT CURRENT AND BIAS IMPEDANCE

BACKGROUND OF THE INVENTION

The invention is in the field of transistor amplifier circuits, and relates more particularly to a high-frequency amplifier circuits as well as bias circuits for such amplifier circuits.

Typically, the output stage of such high-frequency amplifiers is a bipolar transistor connected in a common-emitter configuration, biased with either a voltage source or a current source at the base.

In IC technology, a straightforward way of biasing the output stage is to apply a constant-current source at the base. This current source can directly control the quiescent current in the output stage. However, the collector-to-emitter breakdown voltage of the output stage with a current source coupled to the base is lower than the corresponding breakdown voltage with a voltage source coupled to the base. Accordingy, an alternative technique is to coupled a voltage source to the base of the output transistor. The drawback of this technique is that it becomes difficult to control quiescent current by varying the base voltage because of the exponential relationship between base current and voltage.

Another prior-art technique for providing control of the quiescent current in the output stage is shown in U.S. Pat. No. 5,828,269, having a co-inventor in common with the instant application. In that reference, however, the bias stage for the output transistor is an emitter follower in the RF signal path, which is controlled by another constant-current source. Accordingly, the output impedance of the bias stage affects both the emitter follower stage and the output stage, a less than optimum result.

Accordingly, it would be desirable to have a high-frequency amplifier circuit in which a bias circuit provides independent and direct control of the quiescent current in the output stage and the output impedance of a bias stage which is not in the RF signal path (i.e. the bias impedance of the output stage) in order to enhance operating parameters of the high-frequency amplifier circuit.

SUMMARY OF THE INVENTION

It is therefore an object of the present invention to provide a high-frequency amplifier circuit in which a bias circuit provides independent and direct control of both the quiescent current in the output stage and the output impedance of a bias stage not in the RF signal path. Such an arrangement permits excellent control of gain and class of operation and also permits the circuit to be adjusted for optimum efficiency and linearity.

In accordance with the invention, this object is achieved by a new high-frequency amplifier circuit which includes an amplifying transistor and a bias circuit coupled to the amplifying transistor, with the bias circuit including a first bias subcircuit for controlling a quiescent current in the amplifying transistor and a second bias subcircuit for independently controlling a bias impedance of the amplifying transistor.

In a preferred embodiment of the invention, the first and second bias subcircuits each include an indepently-adjustable current source and a current mirror.

A further preferred embodiment of the invention is directed to a bias circuit coupled to an amplifying transistor of a high-frequency amplifier circuit of the type described above.

Amplifier and bias circuit configurations in accordance with the present invention offer a significant improvement in that independent and direct control of quiescent current in the output stage and output impedance of the bias stage enable accurate control of amplifier gain and class of operation, while providing good efficiency and linearity.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which the single FIGURE shows a simplified schematic diagram of a high-frequency amplifier circuit in accordance with the invention.

DESCRIPTION OF THE PREFERRED EMBODIMENTS

A simplified schematic diagram of a high-frequency amplifier circuit 1 is shown in the single FIGURE of the drawing. The amplifier circuit includes an amplifying transistor 11 and a bias circuit 2 coupled to the base of the amplifying transistor 11 by either an inductor 10a or, in the alternative, a resistor 10b (shown in dashed lines). The bias circuit 2 includes 6 bipolar transistors (12–17) and two current sources 18 and 19 coupled between Vcc and GND, and is described in further detail below. The basic circuit configuration is completed by an input coupling capacitor 20 for coupling an input signal Vin to the base of amplifying transistor 11, with the transistor 11 being connected in a common-emitter configuration and coupled between Vcc and GND by an inductor 21. The output of the high-frequency amplifier circuit 1 is taken from the collector of transistor 11 and is designated as Vout in the drawing.

In accordance with the invention, the amplifying transistor 11 is biased at its base through a single connection (through either inductor 10a or resistor 10b) to bias circuit 2, and the bias circuit contains two subcircuits such that the quiescent current in the amplifying transistor and the output impedance of the bias stage (the bias impedance of the output stage) can be independently and directly controlled by the two current sources 18 and 19, in a manner to be described in further detail hereinafter.

In accordance with a preferred embodiment of the invention, each of the bias subcircuits includes a current source and a current mirror. Thus, current source 18 provides a bias current through a current mirror comprising transistors 15 and 16, while current source 19 provides a bias current component through a current mirror comprising transistors 12, 14 and 17.

In operation, the amplifier transistor 11 of the high-frequency amplifier circuit 1 is typically biased for operation in Class AB for linear applications and biased for operation in Class B or C for high efficiency applications. Accordingly, it is necessary to control the gain and class of the amplifier, and it is also desirable to independently control the efficiency and linearity of the amplifier.

Independent control of these parameters is obtained in accordance with the invention by providing two independent current sources in the bias circuit 2, namely current source 18 for controlling the quiescent current of the output stage and thus its class of operation, and current source 19, which controls the output drive current and thus the output impedance of the bias stage (the bias impedance of the output stage). By setting each of these current sources to the desired value, direct and independent control of class of operation and bias impedance can be effectively achieved.

In the circuit shown, the quiescent current in the output stage is proportional to the current provided by current source 18, thus setting the class of operation, while the output impedance of the bias stage is independently controlled by the current source 19. In this manner, the disclosed circuit permits output-stage gain to be tuned without affecting the bias impedance level.

In overview fashion, and assuming that all transistors in the circuit are identical and perfectly matched, Kirchoff's Law dictates that the sum of the base-emitter voltages of transistors 11 and 13 must be equal to the sum of the base-emitter voltages of transistors 12 and 14. Since the base-emitter voltage of transistor 13 is substantially equal to that of transistor 12, the base-emitter voltage of transistor 11 is therefore substantially equal to that of transistor 14. Since the current from current source 18 flows through transistor 16 it must also flow through transistors 14 and 15, because transistors 15 and 16 form a current mirror. Accordingly, the current in current source 18 dictates the quiescent current in the output transistor 11 and therefore its class of operation and gain.

Again assuming that all transistors are identical and perfectly matched, it can similarly be seen that the current in current source 19 will control the output impedance of the bias circuit. Since transistors 12, 14 and 17 form a current mirror, the current from current source 19 flowing in transistor 17 must also flow in transistor 12 and hence transistor 13. Transistors 12, 13, 14 and 17 form a low impedance path, and the output impedance of the bias circuit is substantially determined by transistors 12 and 17, as dictated by the current provided by current source 19.

By properly scaling the emitter ratios between transistor pairs, a technique well known to those skilled in this art, the quiescent current in transistor 11 can be made directly proportional to the value of the current in current source 18, with the output impedance of the bias circuit being independently controlled by the current in current source 19. Thus, in accordance with the invention the quiescent current in the amplifying transistor 11 can be controlled, while the bias impedance level may be independently set for increased efficiency and linearity.

In the circuit shown in the FIGURE, inductor 10a is provided for coupling the bias circuit to the amplifying transistor 11 while isolating the bias circuit from the RF path. However, since an inductor has a relatively low quality (Q) factor in silicon technology as well as a relatively large area, it may be less economical and less efficient to use an inductor for this purpose. Accordingly, a resistor, designated as resistor 10b, is shown with a dashed-line connection in the FIGURE. This depiction is to be understood to mean that the resistor 10b may be used in place of the inductor 10a as the coupling element between the bias circuit and the amplifying transistor for purposes of economy and/or efficiency. Additionally, the use of resistor 10b can help to control the transition of the amplifying transistor from Class A to Class AB operation, and so long as the voltage drop across this resistor is substantially smaller than one base-emitter voltage, the analysis detailed above will still be valid.

In this manner, the present invention provides a high-frequency amplifier circuit in which the quiescent current in the amplifying transistor and the output impedance of the bias stage which is not in the RF signal path may be independently and directly controlled. This permits effective control of the gain and class of the amplifier, while at the same time achieving improved efficiency and linearity.

While the invention has been particularly shown and described with reference to several preferred embodiments thereof, it will be understood by those skilled in the art that various changes in form and detail may be made without departing from the spirit or scope of the invention. Thus, for example, different types of transistors may be employed, and alterations to the circuit configuration may be made to suit particular design requirements.

What is claimed is:

1. A high frequency amplifier circuit comprising an amplifying transistor and a bias circuit coupled to said amplifying transistor through a single connection, said bias circuit comprising a first bias subcircuit for controlling a quiescent current in said amplifying transistor and a second bias subcircuit for independently controlling a bias impedance of said amplifying transistor.

2. A high-frequency amplifier circuit as in claim 1, wherein said first and second bias subcircuits each comprise an independently-adjustable current source and a current mirror.

3. A high-frequency amplifier circuit as in claim 1, wherein said bias circuit is coupled to said amplifier transistor by an inductor.

4. A high-frequency amplifier circuit as in claim 1, wherein said bias circuit is coupled to said amplifying transistor by a resistor.

5. A high-frequency amplifier circuit as in claim 1, wherein said amplifying transistor and said bias circuit comprise bipolar transistors, said amplifying transistor is connected in a common-emitter configuration, and said bias circuit is coupled to a base of said amplifying transistor.

6. A bias circuit coupled through a single connection to an amplifying transistor of a high-frequency amplifier circuit, said bias circuit comprising a first bias subcircuit for controlling a quiescent current in said amplifying transistor and a second bias subcircuit for independently controlling a bias impedance of said amplifying transistor.

* * * * *